US012752317B2

(12) United States Patent
Chen et al.

(10) Patent No.: US 12,752,317 B2
(45) Date of Patent: *Oct. 6, 2026

(54) SEMICONDUCTOR ARRANGEMENT AND METHOD FOR MAKING

(71) Applicant: TAIWAN SEMICONDUCTOR MANUFACTURING COMPANY LIMITED, Hsin-Chu (TW)

(72) Inventors: Eason Chen, Hemei Township (TW); Yi-Fam Shiu, Toufen City (TW); Sung-Chun Yang, Hsinchu City (TW); Hsu-Shui Liu, Pingjhen City (TW); Yang-Ann Chu, Hsinchu City (TW); Jiun-Rong Pai, Jhubei City (TW)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 545 days.

This patent is subject to a terminal disclaimer.

(21) Appl. No.: 18/231,403

(22) Filed: Aug. 8, 2023

(65) Prior Publication Data

US 2023/0372983 A1 Nov. 23, 2023

Related U.S. Application Data

(62) Division of application No. 17/874,405, filed on Jul. 27, 2022, now Pat. No. 11,786,947, which is a (Continued)

(51) Int. Cl.
*B08B 9/20* (2006.01)
*B08B 9/28* (2006.01)
(Continued)

(52) U.S. Cl.
CPC ................ *B08B 9/205* (2013.01); *B08B 9/28* (2013.01); *F26B 3/30* (2013.01); *F26B 21/50* (2026.01); *H10P 72/3218* (2026.01)

(58) Field of Classification Search
CPC ........... B08B 9/205; B08B 9/28; B08B 3/022; B08B 13/00; F26B 3/30; F26B 21/50;
(Continued)

(56) References Cited

U.S. PATENT DOCUMENTS 5,746,008 A 5/1998 Yamashita et al.
6,096,100 A 8/2000 Guldi et al.
(Continued)

FOREIGN PATENT DOCUMENTS

CN 1539161 A 10/2004
CN 105579153 A 5/2016
(Continued)

OTHER PUBLICATIONS

KR-20140084511-A, Machine Translation. (Year: 2026).*
KR-20180117061-A, Machine Translation. (Year: 2026).*

*Primary Examiner* — Binh X Tran
*Assistant Examiner* — Christopher Remavege
(74) *Attorney, Agent, or Firm* — Cooper Legal Group, LLC

(57) ABSTRACT

A cleaning apparatus, method, and dry chamber are provided for cleaning a wafer carrier that holds wafers as part of a semiconductor fabrication process. The cleaning apparatus includes a wet chamber that receives the wafer carrier to be washed and a reservoir in fluid communication with the wet chamber. The reservoir stores a cleaning liquid that is introduced to the wafer carrier within the wet chamber during a washing operation, and a dry chamber is spaced apart from the wet chamber. The dry chamber receives the wafer carrier after the wafer carrier is washed in the wet chamber and holds the wafer carrier during a drying operation. A transport system transports the wafer carrier between the wet chamber and the dry chamber during a cleaning process.

20 Claims, 6 Drawing Sheets

Related U.S. Application Data division of application No. 16/887,409, filed on May 29, 2020, now Pat. No. 11,813,649.

(51) Int. Cl.

| | |
|---|---|
| ***F26B 3/30*** | (2006.01) |
| ***F26B 21/50*** | (2026.01) |
| ***H10P 72/30*** | (2026.01) |

(58) Field of Classification Search

CPC .... F26B 5/08; F26B 5/04; F26B 11/18; H10P 72/3218; H10P 72/0406; H10P 72/0414

See application file for complete search history.

(56) References Cited

U.S. PATENT DOCUMENTS

| | | | |
|---|---|---|---|
| 6,267,123 | B1 | 7/2001 | Yoshikawa et al. |
| 6,358,328 | B1 | 3/2002 | Yang et al. |
| 9,514,972 | B2 | 12/2016 | Schneller et al. |
| 2001/0020480 | A1 | 9/2001 | Yoshikawa et al. |
| 2002/0100495 | A1 | 8/2002 | Bexten et al. |
| 2005/0011540 | A1 | 1/2005 | Dolechek et al. |
| 2006/0185692 | A1 | 8/2006 | Moran et al. |
| 2012/0325273 | A1 | 12/2012 | Rebstock |
| 2014/0069467 | A1 | 3/2014 | Rebstock |
| 2014/0158172 | A1 | 6/2014 | Hsu et al. |
| 2018/0286726 | A1 | 10/2018 | Rebstock |
| 2019/0247900 | A1 | 8/2019 | Park et al. |

FOREIGN PATENT DOCUMENTS

| | | | | | |
|---|---|---|---|---|---|
| CN | 102804332 | B | | 6/2017 | |
| CN | 109304318 | A | | 2/2019 | |
| CN | 110125065 | A | | 8/2019 | |
| KR | 101330990 | B1 | | 9/2012 | |
| KR | 20140084511 | A | * | 7/2014 | ............... B08B 3/02 |
| KR | 20180117061 | A | * | 10/2018 | ............... B08B 9/34 |
| TW | 502296 | B | | 9/2002 | |
| TW | 200531180 | A | | 9/2005 | |
| TW | I301291 | B | | 9/2008 | |
| WO | 2004093147 | A2 | | 10/2004 | |

* cited by examiner

SEMICONDUCTOR ARRANGEMENT AND METHOD FOR MAKING

RELATED APPLICATION

This application is a divisional of and claims priority to U.S. patent application Ser. No. 17/874,405, titled "SEMICONDUCTOR ARRANGEMENT AND METHOD FOR MAKING" and filed on Jul. 27, 2022, which is a divisional of and claims priority to U.S. patent application Ser. No. 16/887,409, titled "SEMICONDUCTOR ARRANGEMENT AND METHOD FOR MAKING" and filed on May 29, 2020. U.S. patent application Ser. No. 17/874,405 and U.S. patent application Ser. No. 16/887,409 are incorporated herein by reference.

BACKGROUND

During semiconductor fabrication, various layers are formed and processed, such as by etching, to establish semiconductor arrangements that have one or more features. As the features of semiconductor arrangements continue to become smaller, the fabrication processes become more susceptible to defects caused by the presence of contaminants introduced to the semiconductor wafers during fabrication. Sterile environments are established within process chambers to reduce the presence of contaminants therein. But wafer carriers used to transport semiconductor wafers between the process chambers have the potential to introduce contaminants to these sterile environments and the semiconductor wafers being transported.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
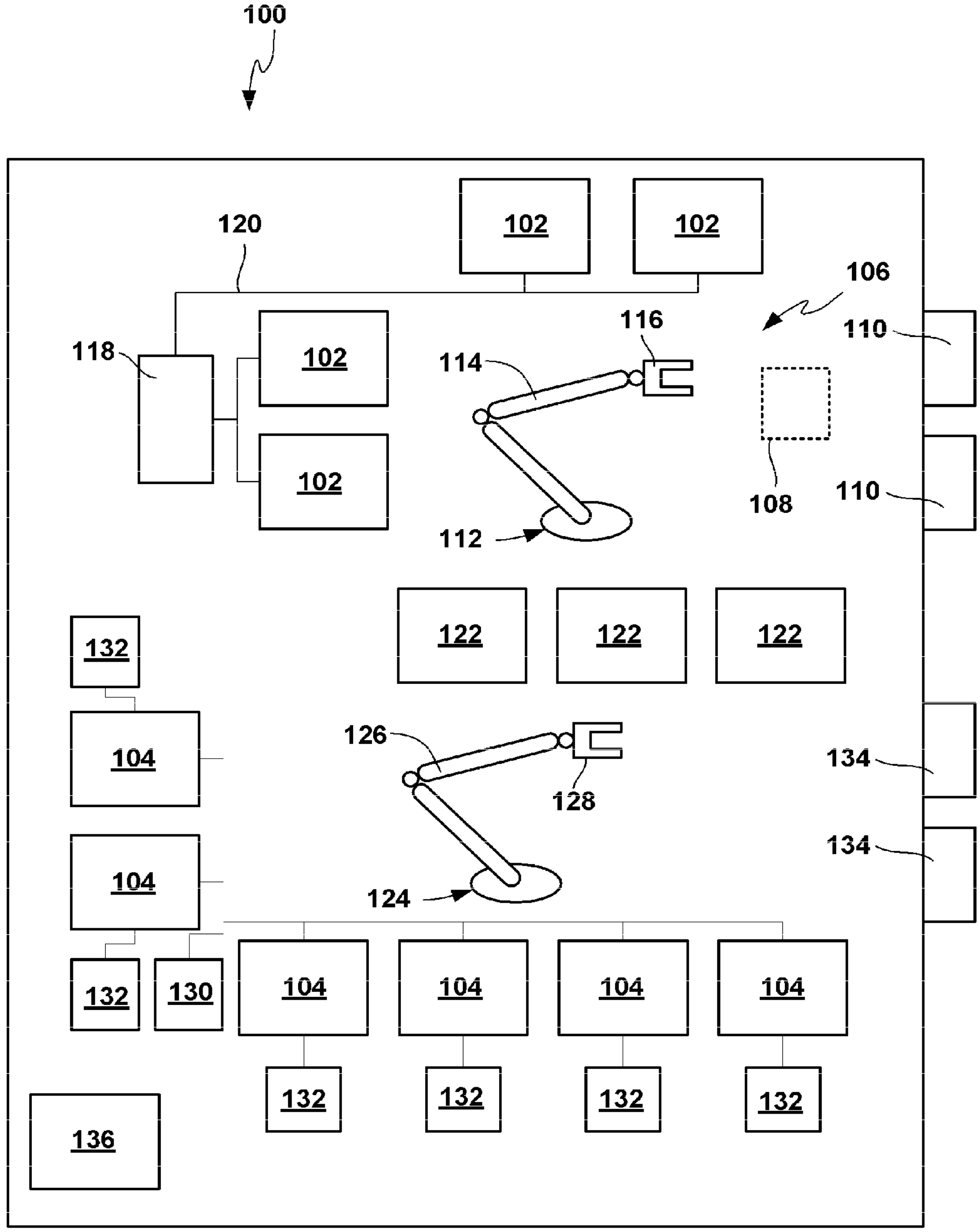
FIG. 1 illustrates a cleaning apparatus in accordance with some embodiments.

The following disclosure provides many different embodiments, or examples, for implementing different features of the provided subject matter. Specific examples of components and arrangements are described below to simplify the present disclosure. These are, of course, merely examples and are not intended limiting. For example, the formation of a first feature over or on a second feature in the description that follows may comprise embodiments in which the first and second features are formed in direct contact, and may also comprise embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments relate generally to a cleaning method and apparatus for cleaning a wafer carrier that is used during semiconductor fabrication. In some embodiments, the cleaning apparatus comprise a wet chamber in which the wafer carrier is washed. According to some embodiments, the cleaning apparatus comprises a dry chamber, which is separate from the wet chamber, in which the washed wafer carrier is dried. In some embodiments, a robotic transport system is configured to autonomously transport the washed wafer carrier between the wet chamber and the dry chamber.

In some embodiments, the wet chamber is in fluid communication with a water supply system. In some embodiments, the water supply system introduces deionized water that has a temperature of less than about sixty six degrees Fahrenheit (66° F.) to the wafer carrier within the wet chamber to wash the wafer carrier.

According to some embodiments, the wet chamber comprises a spin chuck that supports the wafer carrier in the wet chamber. In some embodiments, the spin chuck is pivotal about an axis of rotation to pivot the wafer carrier within the wet chamber. In some embodiments, pivoting the wafer carrier within the wet chamber exposes a plurality of regions of the wafer carrier to a nozzle that introduces deionized water into the wet chamber. In some embodiments, pivoting the wafer carrier within the wet chamber establishes a centrifugal force that causes at least some of the deionized water to be expelled from the wafer carrier within the wet chamber.

In some embodiments, following completion of a washing operation within the wet chamber, the robotic transport system is configured to remove the washed wafer carrier from the wet chamber and to transfer the washed wafer carrier between the wet chamber and the dry chamber. According to some embodiments, the robotic transport system comprises an arm that is adjustable in three dimensions and a head that cooperates with a portion of the wafer carrier. In some embodiments, with the head coupled to the washed wafer carrier, the robotic transport system removes the washed wafer carrier from the wet chamber and introduces the washed wafer carrier to the dry chamber.

In some embodiments, the wet chamber is plumbed to a container that supplies a gas to the wet chamber. Examples of the gas comprise nitrogen, clean dry air (CDA), or any other gas suitable for establishing a controlled atmosphere within the wet chamber during the washing operation. In some embodiments, the dry chamber is in fluid communication with a vacuum pump, such as a dry pump for example, and the dry chamber is at least partially evacuated through operation of the vacuum pump to establish a sub-atmospheric pressure within the dry chamber. In some embodiments, the controlled atmosphere comprises an inert environment established by introduction of the gas and evacuation of the dry chamber to reduce or otherwise control the presence of airborne contaminants therein.

In some embodiments, the dry chamber is arranged adjacent to at least one infrared lamps. In some embodiments, the infrared lamp is a heating element that emits infrared radiation having a wavelength of about 700 nm to about 1 mm that is imparted onto the washed wafer within the dry chamber.

According to some embodiments, the dry chamber comprises a spin chuck that supports the wafer carrier within the dry chamber. In some embodiments, the spin chuck pivots about an axis of rotation to pivotally adjust an orientation of the wafer carrier within the dry chamber and generate a centrifugal force that removes a portion of the cleaning liquid from the wafer carrier during a drying operation. In some embodiments, the dry chamber comprises a plurality of infrared lamps. In some embodiments, at least a first infrared lamp and a second infrared lamp of the plurality of infrared lamps are separated in a radial direction from a rotational axis of the spin chuck, by a portion of the spin chuck itself. Thus, at least one infrared lamp is arranged within a central region of a spin chuck comprising an annular shape, or at least one infrared lamp is arranged outside of the interior space of the annular spin chuck.

For example, some embodiments of the dry chamber comprise a first infrared lamp positioned adjacent to the rotational axis of the spin chuck, within the central region of the spin chuck. Some embodiments of the first infrared lamp comprise a filament and a gas, such as a halogen gas or other suitable gas, enclosed within a bulb, such as a glass bulb, that protrudes upward from a floor of the dry chamber. Energizing the filament emits infrared radiation to be imparted on different portions of the wafer carrier exposed to the first infrared lamp as the wafer carrier is rotated by the spin chuck. According to some embodiments, a plurality of infrared lamps are arranged within the central region of the spin chuck. The plurality of infrared lamps are arranged at different angular positions about the rotational axis of the spin chuck, spaced in a radial direction toward the spin chuck. According to such embodiments, different portions of the wafer carrier supported by the spin chuck pass adjacent to the infrared lamps as the spin chuck is rotated.

For some embodiments, one or a plurality of infrared lamps are arranged a radial distance from the rotational axis of the spin chuck, externally of an outer periphery of the spin chuck. For example, a first exterior infrared lamp extends upward from the floor of the dry chamber at a first location outside of the spin chuck. A second exterior infrared lamp extends upward from the floor of the dry chamber at a second location outside of the spin chuck. The first location of the first exterior infrared lamp is a defined angle about the rotational axis of the spin chuck from the second exterior infrared lamp. Examples of the defined angle comprise any angle between fifteen degrees (15°) and three hundred forty five degrees (345°). In some embodiments, the defined angle is selected to control heating. For example, heat generated by an exterior infrared lamp may propagate or spread by approximately fifteen degrees (15°) in the space between the exterior infrared lamp and an edge of the spin chuck. Therefore, to promote uniform heating, the defined angle between two, adjacent exterior infrared lamps may be selected to be fifteen degrees (15°).

According to some embodiments, the first exterior infrared lamp and the second exterior infrared lamp are separated approximately one hundred eighty degrees (180) apart from each other about the rotational axis of the spin chuck. For such embodiments, different portions of the wafer carrier supported by the spin chuck are occasionally positioned adjacent to the first exterior infrared lamp and the second exterior infrared lamp as the spin chuck rotates.

Some embodiments of the dry chamber comprise different arrangements of the infrared lamps or other heating elements. For example, four infrared lamps can be arranged at approximately ninety degree (90°) intervals about the rotational axis of the spin chuck. According to such embodiments, a substantial portion of the wafer carrier is exposed to thermal radiation emitted by the four infrared lamps for most of the rotation about the rotational axis.

With reference to the drawings, FIG. 1 illustrates a cleaning apparatus 100 in accordance with some embodiments. In some embodiments, the cleaning apparatus 100 is configured as a stand-alone unit, comprising both washing and drying functions. In some embodiments, the cleaning apparatus comprises at least one wet chamber 102, at least one dry chamber 104, and a transport system 106 that transports a wafer carrier 108 (shown in broken lines) between the wet chamber 102 and the dry chamber 104. Combining the wet chamber 102, the dry chamber 104, and the transport system 106 as part of a collaborative cleaning apparatus, in some embodiments, creates an efficient module for cleaning and drying the wafer carrier 108 with one appliance. In some embodiments, requiring the wafer carrier 108 to be removed from one apparatus and transported to a separate, remotely-located apparatus for isolated washing and drying operations is avoided, thereby minimizing the floor space required within a fabrication space for cleaning wafer carriers and reducing or otherwise controlling the opportunity to introduce contaminants to the wafer carriers during cleaning. For example, the wafer carrier 108 may include a semiconductor wafer pod, a cassette, a front opening unified pod or a front opening universal pod (FOUP).

According to some embodiments, the cleaning apparatus 100 comprises at least one load port 110, and the wafer carrier 108 is introduced to the cleaning apparatus 100 from an ambient environment to be cleaned via a load port 110 of the at least one load port. The load port 110 defines a location where the wafer carrier 108 is deposited by an overhead hoist transfer system (not shown) or another automated transport device or is manually deposited by a technician to be introduced into the cleaning apparatus 100.

In some embodiments, a first robot 112 of the transport system 106 is operable to retrieve the wafer carrier 108 from the load port 110 and transport the wafer carrier to an available wet chamber 102. In some embodiments, a wet chamber 102 is available for performing a washing operation when the wet chamber 102 does not contain another wafer carrier. Accordingly, the transport system 106 can load and unload the wafer carrier 108 in the cleaning apparatus 100 without contamination of the wafer carrier 108 from external environment.

In some embodiments, the first robot 112 comprises an arm 114 supporting a head 116. In some embodiments, the arm 114 is adjustable to position the head 116 adjacent to the wafer carrier 108 at the load port 110, where the head 116 couples the wafer carrier 108 to the arm 114. In some embodiments, one or more servo motors, a hydraulic actuator, or any other actuator provided to the first robot 112 adjusts a position of the head 116 in three dimensions to carry the wafer carrier 108 between the load port 110 and the wet chamber 102.

Figure 2:
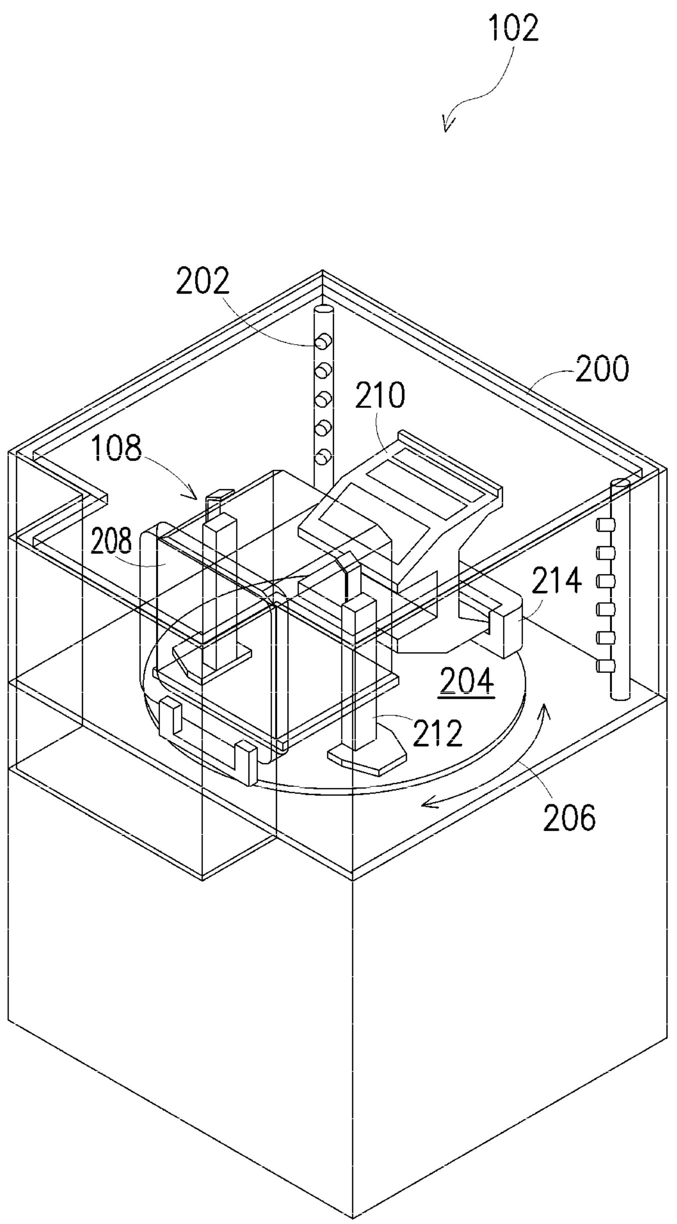
FIG. 2 is a perspective view of a wet chamber of a cleaning apparatus, in accordance with some embodiments.

FIG. 2 illustrates a wet chamber 102, in accordance with some embodiments. The wet chamber 102 comprises an enclosure 200 that receives the wafer carrier 108 transported by the first robot 112. In some embodiments, the enclosure 200 comprises a cleaning liquid, such as deionized water, that is supplied by a reservoir 118, illustrated in FIG. 1, through a pipe network 120. In some embodiments, the cleaning liquid is sprayed onto the wafer carrier 108 during a washing operation. In some embodiments, the enclosure protects the wafer carrier 108 from foreign contaminants while the wafer carrier 108 is being washed during the washing operation.

According to some embodiments, the wet chamber 102 comprises one or more nozzles 202 that direct the cleaning liquid onto the wafer carrier 108 within the wet chamber 102. In some embodiments, the one or more nozzles 202 are located within the enclosure 200 of the wet chamber 102 and are in fluid communication with the reservoir 118 via the pipe network 120. Examples of the cleaning liquid comprise, but are not limited to, deionized water at a temperature that is less than room temperature (e.g., 70° F.). According to some embodiments, the deionized water sprayed onto the wafer carrier 108 is less than sixty six degrees Fahrenheit (66° F.) during the washing operation to avoid heating the wafer carrier 108 or minimize process costs by avoiding incurring costs associated with heating the deionized water.

In some embodiments, the wet chamber comprises a spin chuck 204. In some embodiments, the spin chuck 204 supports the wafer carrier 108 within the wet chamber 102 and pivots about an axis of rotation in one or both directions indicated by arrow 206. In some embodiments, the spin chuck 204 pivotally adjusts an orientation of the wafer carrier 108 relative to the one or more nozzles 202 within the enclosure 200 of the wet chamber 102, thereby exposing different portions of the wafer carrier 108 to the cleaning liquid emitted by the one or more nozzles 202. According to some embodiments, the spin chuck 204 pivotally adjusts an orientation of the wafer carrier 108 within the enclosure 200 to impart a centrifugal force on the wafer carrier 108, thereby removing at least a portion of the cleaning liquid from the wafer carrier 108 before the wafer carrier 108 is removed from the wet chamber 102 by the transport system 106.

As illustrated in FIG. 2, in some embodiments, a pod 208 forming an outer enclosure of the wafer carrier 108 and a cassette 210 that is to be received within the pod 208 are individually coupled to the spin chuck 204. In some embodiments, the cassette 210 is configured to receive a plurality of semiconductor wafers, and the pod 208 defines an interior space that receives the cassette 210 supporting the plurality of semiconductor wafers. In some embodiments, a first clamp 212 of the spin chuck 204 couples the pod 208 to the spin chuck 204, and a second clamp 214 separately couples the cassette 210 to the spin chuck 204. According to some embodiments, the cassette 210 is at least partially removed, or fully removed, from the interior space defined by the pod 208 while the pod 208 and the cassette 210 are coupled to the spin chuck 204.

With reference back to FIG. 1, according to some embodiments, the wafer carrier 108 is transported by the first robot 112 of the transport system 106 to a buffer chamber 122. In some embodiments, the cleaning apparatus 100 comprises a plurality of buffer chambers 122 to store a plurality of wafer carriers 108 in a queue to await an available dry chamber 104 for performance of a drying operation. In some embodiments, each buffer chamber 122 stores a washed wafer carrier 108 between completion of the washing operation within the wet chamber 102 and introduction of the wafer carrier 108 to the dry chamber 104.

In some embodiments, the buffer chambers 122 are positioned between the first robot 112 of the transport system 106 and a second robot 124 of the transport system 106. In some embodiments, the buffer chambers 122 are accessible to the first robot 112 and the second robot 124. For example, the first robot delivers washed wafer carriers 108 to the buffer chambers 122, from where the second robot 124 retrieves the washed wafer carriers 108 and transports the washed wafer carriers 108 between the buffer chambers 122 and the dry chambers 104. Accordingly, in some embodiments, the wafer carriers 108, once introduced to the cleaning apparatus 100 via the load ports 110, are washed and dried during a cleaning process before being removed from the cleaning apparatus 100.

In some embodiments, the second robot 124 comprises an arm 126 supporting a head 128. In some embodiments, the arm 126 is adjustable to position the head 128 adjacent to the wafer carrier 108 at the buffer chamber 122, where the head 128 couples the wafer carrier 108 to the arm 126. In some embodiments, one or more servo motors, a hydraulic actuator, or any other actuator provided to the second robot 124 adjusts a position of the head 128 in three dimensions to carry the wafer carrier 108 between the buffer chamber 122 and the dry chamber 104. In some embodiments, the transport system 106 autonomously transports the wafer carrier 108 between the wet chamber 102, the buffer chamber 122, and the dry chamber 104.

Figure 3:
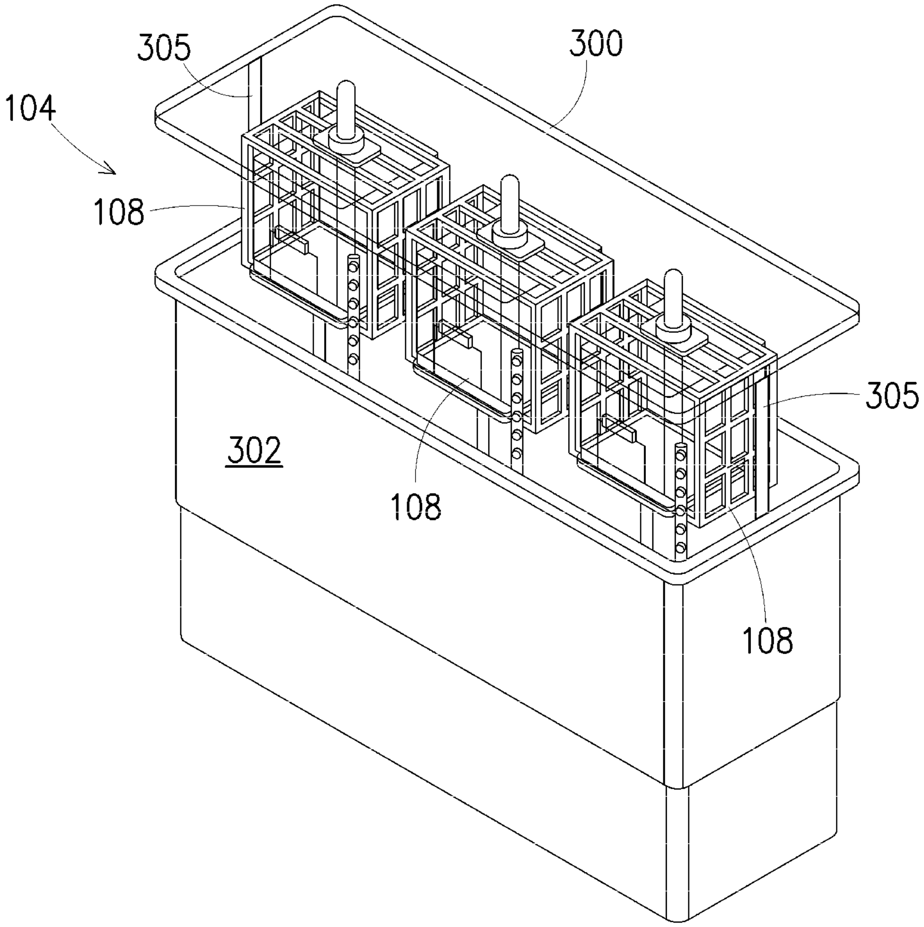
FIG. 3 is a perspective view of wafer carriers received by a dry chamber of a cleaning apparatus in an open state, in accordance with some embodiments.
Figure 4:
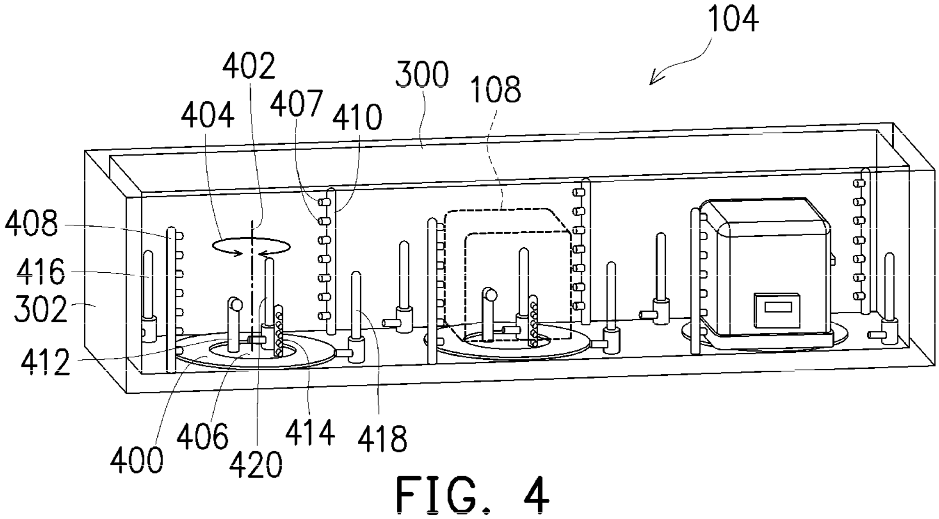
FIG. 4 is a perspective view of wafer carriers received by a dry chamber of a cleaning apparatus in a closed state, in accordance with some embodiments.

FIG. 3 is a perspective view of wafer carriers 108 received by a dry chamber 104 in an open state, in accordance with some embodiments. In some embodiments, while in the open state, the dry chamber 104 is configured to receive washed wafer carriers 108 transported from the buffer chamber(s) 122 by the second robot 124. According to some embodiments, the dry chamber 104 comprises a top surface 300 that is adjustable between an elevated position above a basin 302, as shown in FIG. 3, and a lowered position in which the top surface 300 is proximate to or in contact with an upper portion of the basin 302, as shown in FIG. 4. In some embodiments, the dry chamber 104 is in the open state and configured to receive the wafer carriers 108 while the top surface 300 is elevated above the basin 302 as shown in FIG. 3. In some embodiments, the wafer carriers 108 are delivered to the dry chamber 104 to be suspended in a downward-opening orientation relative to the basin 302. In some embodiments, in the downward-opening orientation, an open end of the wafer carriers 108 faces into the basin 302. In some embodiments, once the wafer carriers 108 are suspended from the top surface 300, a suspension system 305 comprising an actuator, such as a hydraulic cylinder, linear actuator, rack and pinion gear system, or any other suitable actuator, lowers the top surface 300, and accordingly, the suspended wafer carriers 108, into the basin 302.

With reference to FIG. 4, according to some embodiments, the top surface 300 is lowered into the basin 302 to place the suspended wafer carriers 108 adjacent to a spin chuck 400 disposed within the basin 302, thereby reconfiguring the dry chamber 104 into the closed state.

In some embodiments, a portion of the wafer carriers 108 cooperates with the spin chuck 400 of the dry chamber 104, and the spin chuck 400 pivots about an axis of rotation 402 in one or both directions indicated by arrow 404. In some embodiments, the spin chuck 400 pivotally adjusts an orientation of the wafer carriers 108 relative to a gas nozzle, a heating element, or both a gas nozzle and a heating element to expose a plurality of different surfaces of the wafer carrier 108 to the gas nozzle, the heating element, or both the gas nozzle and the heating element. In some embodiments, the spin chuck 400 is rotated at an angular velocity of at least five hundred revolutions per minute (500 rpm) while exposing the wafer carrier 108 to a gas such as diatomic nitrogen or CDA, for example.

For example, in some embodiments, the spin chuck 400 is annular in shape, defining an interior space 406. In some embodiments, the basin 302 comprises an environmental control system that emits gas into the dry chamber 104 to promote drying of the wafer carriers 108 and to create a controlled environment that reduces or otherwise controls impurities within the dry chamber 104. According to some embodiments, at least one gas nozzle is positioned a first radial distance from the axis of rotation 402, and at least one gas nozzle is positioned at a second radial distance from the axis of rotation 402. In some embodiments, the second radial distance is less than the first radial distance. In some embodiments, the at least one gas nozzle positioned the first radial distance from the axis of rotation 402 is located externally of the spin chuck 400, such that the first radial distance is greater than a radial distance at which an exterior circumferential wall of the spin chuck 400 is located. In some embodiments, the at least one gas nozzle positioned the second radial distance from the axis of rotation 402 is disposed within the interior space 406 defined by the spin chuck 400. For example, a first gas nozzle 408 and a second gas nozzle 410 are arranged radially outward of the annular spin chuck 400, and thus the first gas nozzle 408 and the second gas nozzle 410 are located at radial distances, relative to the axis of rotation 402, that are greater than a radial distance at which an exterior circumferential wall of the spin chuck 400 is located. In some embodiments, the first gas nozzle 408 and the second gas nozzle 410 are arranged an angular distance apart from each other about the external periphery of the annular spin chuck 400. In some embodiments, the angular distance is approximately one hundred eighty (180°) degrees about the spin chuck 400, to be arranged on opposite sides of the spin chuck 400.

According to some embodiments, at least one gas nozzle is arranged to extend upward from a bottom of the basin 302 within the interior space 406 defined by the spin chuck 400. For example, a third gas nozzle 412 and a fourth gas nozzle 414 are arranged within the interior space 406. Regardless of their location(s), the gas nozzle(s) is/are in fluid communication with a gas source 130, as illustrated in FIG. 1. In some embodiments, the gas source 130 supplies an inert gas, such as Nitrogen, or CDA, for example.

Some embodiments of the heating element comprise a device, such as an infrared lamp, that emits thermal radiation arranged to extend upward within the basin 302 radially inside of the spin chuck 400, within the interior space 406, or radially outside of the exterior space of the spin chuck 400. For example, a first heating element 416 is arranged radially outward, beyond an external periphery of the spin chuck 400, in accordance with some embodiments. A second heating element 418 is arranged radially outward, beyond an external periphery of the spin chuck 400, in accordance with some embodiments. According to some embodiments, a third heating element 420 is arranged to extend upward, within the interior space 406 defined by the spin chuck 400.

In some embodiments, the first heating element 416, the second heating element 418, and the third heating element are independently selected to be an infrared heating element, a resistive heating element, an inductive heating element, or any other heating element suitable to emit thermal energy to be used to dry the wafer carrier 108 in the dry chamber 104.

Although the first heating element 416 and the second heating element 418 extend upward from a floor of the basin 302, outside of the interior space 406, and the third heating element 420 extends upward within the interior space 406, the present disclosure is not so limited. For some embodiments, a plurality of heating elements, such as the second heating element 418 and the third heating element 420, may extend upward within the interior space 406, and the first heating element 416 may extend upward outside of the interior space 406. According to some embodiments, heating elements are arranged at angular locations spaced approximately ninety degrees (90°) apart about the axis of rotation 402 of the spin chuck 400, within the interior space 406 or outside of the interior space 406. Substantially linear heating elements that do not span the spin chuck 400 allow for portions of the wafer carrier 108 to be positioned between, or to be rotated along a path that extends between heating elements. However, some embodiments comprise different arrangements of heating elements that extend in a horizontal direction, for example, allowing the wafer carrier 108 to be inserted over such heating elements in a lateral direction.

As illustrated in FIG. 4, with the dry chamber 104 in the closed state, the open end of the wafer carrier 108 is placed over at least one of the third gas nozzle 412 or the fourth gas nozzle 414. In some embodiments, portions of the wafer carrier 108 are arranged between the first gas nozzle 408 and the third gas nozzle 412 to promote concurrent drying of the wafer carrier 108 internally and externally. According to some embodiments, portions of the wafer carrier 108 are placed between the first heating element 416 and the third heating element 420 to promote concurrent internal and external drying of the wafer carrier 108. In some embodiments, as the spin chuck 400 is pivotally adjusted, the wafer carrier 108 is rotated so different portions of the wafer carrier 108 are positioned between the first heating element 416 and the third heating element 420 and between the first gas nozzle 408 and the third gas nozzle 412. In some embodiments, pivotal adjustment of the wafer carrier 108 in the dry chamber also imparts on the wafer carrier 108 a centrifugal force that removes at least a portion of the residual cleaning liquid on the wafer carrier 108.

In some embodiments, the first gas nozzle 408 is arranged outside of the interior space 406 of the spin chuck 400, and the interior space 406 of the spin chuck is devoid of gas nozzles. According to some embodiments, the fourth gas nozzle 414 extends upward from a floor within the interior space defined by the spin chuck 400, and the space outside of the spin chuck 400 is devoid of gas nozzles. At least one of the first gas nozzle 408, the second gas nozzle 410, the third gas nozzle 412, or the fourth gas nozzle 414 comprises at least one, or a plurality of, apertures 407. Some embodiments of the aperture(s) 407 are defined by a perimeter wall forming an oval opening that extends in a vertical direction a greater extent than the oval opening extends in a horizontal direction. According to some embodiments, the aperture(s) 407 are defined by a perimeter wall forming a circular opening, and a plurality of the circular apertures 407 are arranged along a vertical axis to concurrently direct a gas over a plurality of different regions of the wafer carrier 108.

Various different gas nozzle arrangements are also within the scope of the dry chamber 104. For example, the one or more gas nozzles extend in a horizontal direction within the dry chamber 104 according to some embodiments, directing gas generally toward a wafer carrier 108 supported with the open end facing a lateral direction. According to some embodiments, at least one of the first gas nozzle 408, the second gas nozzle 410, the third gas nozzle 412, or the fourth gas nozzle 414 are recessed within a surface of the dry chamber 104. For example, at least one of the first gas nozzle 408, the second gas nozzle 410, the third gas nozzle 412, or the fourth gas nozzle 414 is flush with a floor, side wall, or other surface defining a portion of the dry chamber 104 to direct an airflow of a drying gas toward one or more wafer carriers 108 in the dry chamber 104.

Referring back to FIG. 1, according to some embodiments, at least one of the dry chambers 104 is in fluid communication with a dry pump 132. In some embodiments, the dry pump 132 is operable to at least partially evacuate the dry chamber 104 while the dry chamber 104 is in the closed state, thereby reducing or otherwise controlling the presence of contaminants therein. For example, the dry pump is configured to adjust the pressure within at least one of the dry chambers 104 to be at a pressure of 0.1 torr or greater.

Following completion of a drying operation in the dry chamber 104, the second robot 124 retrieves the dried wafer carrier 108 from the dry chamber 104, and transports the dried wafer carrier 108 to a discharge port 134, in accordance with some embodiments. In some embodiments, an overhead hoist transfer system or other material handling system, or a lab technician can retrieve the cleaned wafer carrier 108 from the discharge port 134 to be used for supporting wafers subjected to semiconductor fabrication operations for constructing integrated circuits.

Figure 5:
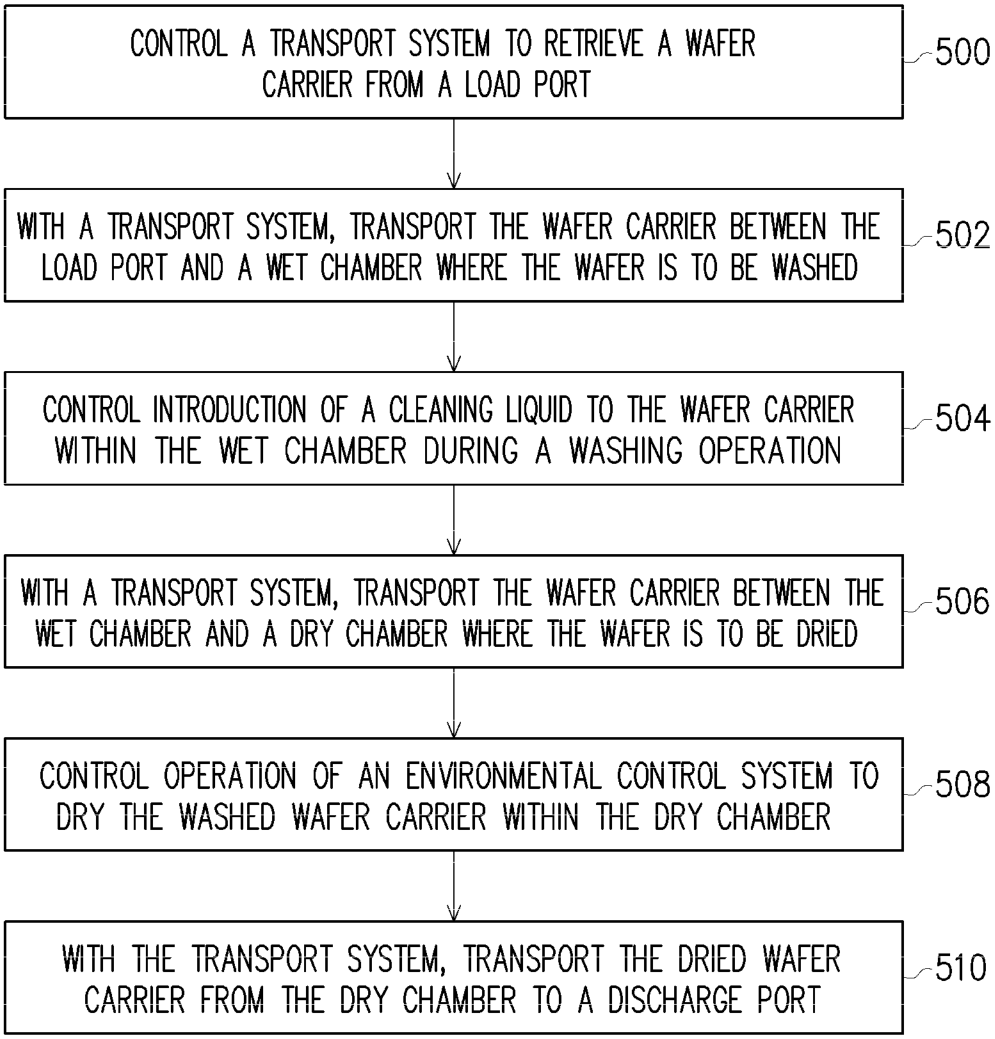
FIG. 5 is a flow chart illustrating a method of cleaning a wafer carrier, in accordance with some embodiments.

FIG. 5 is a flow diagram illustrating a method of cleaning a wafer carrier 108, in accordance with some embodiments. According to some embodiments, the method is performed by a controller 136, as illustrated in FIG. 1, comprising a computing device that executes computer-executable instructions stored in a non-transitory computer readable medium. In some embodiments, the controller 136 controls the first robot 112 of the transport system 106 to retrieve the wafer carrier 108 to be cleaned from a load port 110 at block 500. In some embodiments, the first robot 112 transports the retrieved wafer carrier 108 between the load port 110 and a wet chamber 102 at block 502.

According to some embodiments, the first robot 112 introduces the wafer carrier 108 into the wet chamber 102 and establishes communication between the wafer carrier 108 and the spin chuck 204. For example, a cassette 210 of the wafer carrier 108 is removed from the pod 208, and the cassette 210 and the pod 208 are each coupled to the spin chuck 204, allowing the cassette 210 and the pod 208 to each be cleaned.

Some embodiments of a washing operation are commenced by introducing a cleaning liquid to the wafer carrier 108 within the wet chamber 102 at block 504. The cleaning liquid is deionized water that is at a temperature of less than sixty six degrees Fahrenheit (66° F.) for some embodiments, and is introduced through a plurality of nozzles 202.

In some embodiments, following completion of the washing operation, the first robot 112 and the second robot 124 of the transport system 106 are controlled to transport the washed wafer carrier 108 between the wet chamber 102 and the dry chamber 104 at block 506. According to some embodiments, the washed wafer carrier 108 is staged in a buffer chamber by the first robot 112. In some embodiments, when a dry chamber 104 or the second robot 124 is available, the second robot 124 retrieves the washed wafer carrier from the buffer chamber 122 and provides the washed wafer carrier 108 to the dry chamber 104.

In some embodiments, with the wafer carrier 108 in the dry chamber 104, delivery of a drying gas into the dry chamber 104 via one or a plurality of gas nozzles or via operation of one or a plurality of heating elements of an environmental control system is controlled at block 508. Introduction of the drying gas by the gas nozzle(s) or the delivery of thermal energy by the heating element(s) concurrently dries the interior and the exterior of the wafer carrier 108 according to some embodiments. The spin chuck 400 pivotally adjusts an orientation of the wafer carriers 108 relative to the gas nozzles 408, 410, 412, 414 as the air is distributed under pressure and ejected from the gas nozzles 408, 410, 412, 414. The ejected air impinges against the wafer carriers 108 to dislodge or remove the cleaning liquid or contaminants from the wafer carriers 108 and reduce the contamination during transport of the wafer carriers 108. In some embodiments, once drying is complete, the second robot 124 of the transport system 106 is controlled to transport the dried wafer carrier 108 between the dry chamber 104 and the discharge port 134 at block 510.

Figure 6:
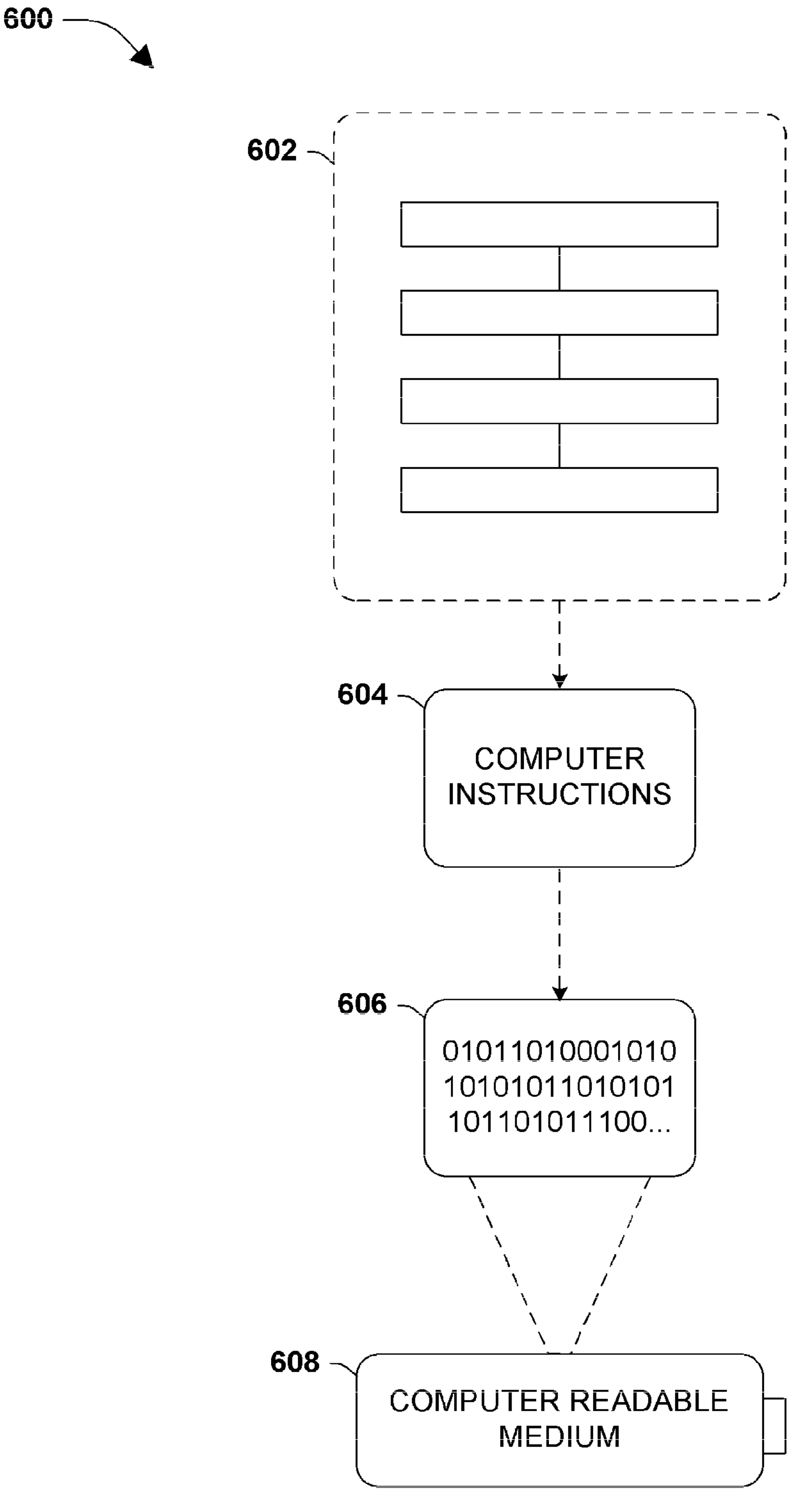
FIG. 6 illustrates an example computer-readable medium wherein processor-executable instructions configured to embody one or more of the provisions set forth herein may be comprised, in accordance with some embodiments.

Still another embodiment involves a computer-readable medium comprising processor-executable instructions configured to implement one or more of the techniques presented herein. An exemplary computer-readable medium is illustrated in FIG. 6, wherein the embodiment 600 comprises a computer-readable medium 608 (e.g., a CD-R, DVD-R, flash drive, a platter of a hard disk drive, etc.), on which is encoded computer-readable data 606. This computer-readable data 606 in turn comprises a set of processor-executable computer instructions 604 configured to operate according to one or more of the principles set forth herein. In some embodiments 600, the processor-executable computer instructions 604 are configured to perform a method 602, such as at least some of the aforementioned described methods. In some embodiments, the processor-executable computer instructions 604 are configured to implement a system, such as at least some of the aforementioned systems. Many such computer-readable media may be devised by those of ordinary skill in the art that are configured to operate in accordance with the techniques presented herein.

Figure 7:
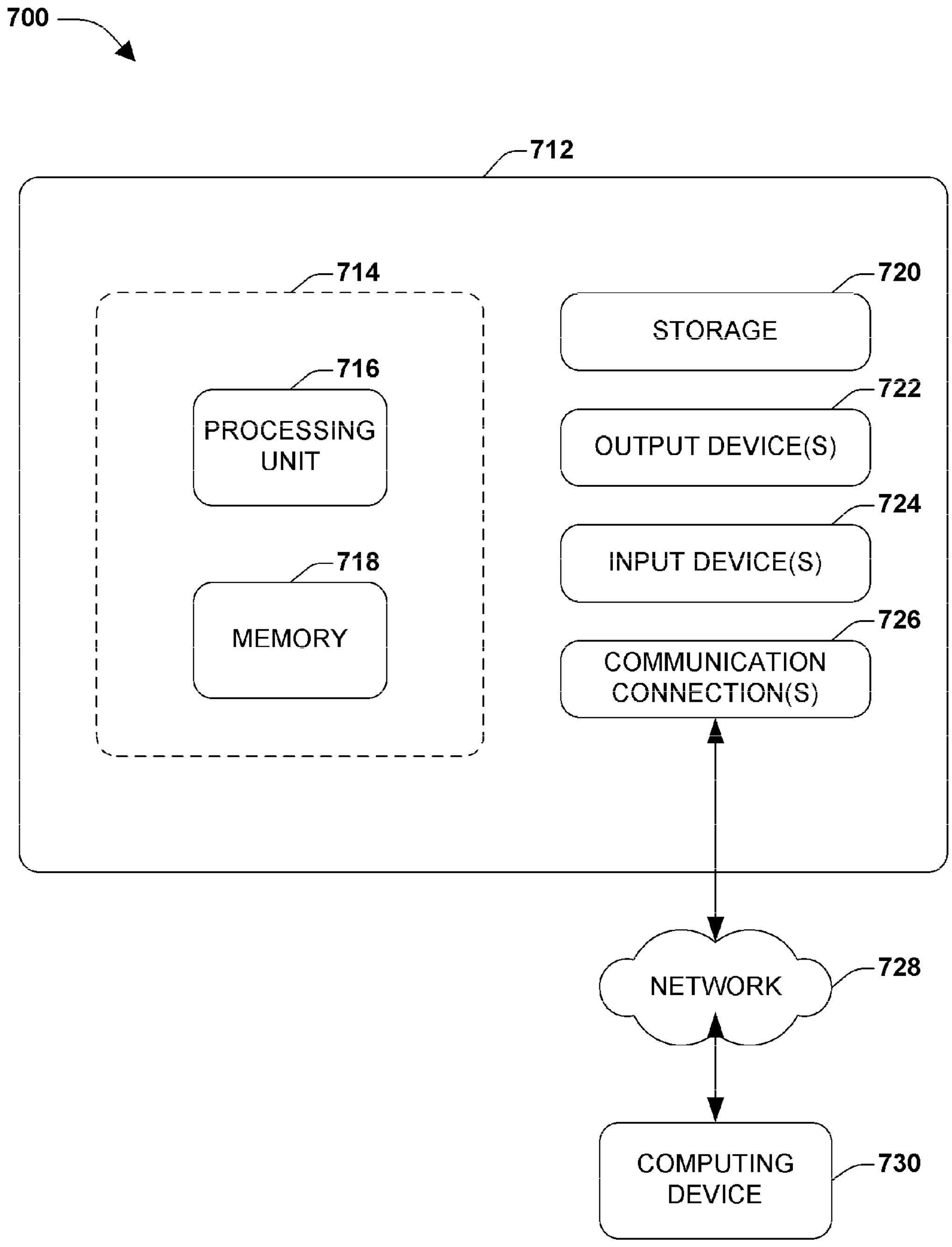
FIG. 7 illustrates an example computing environment wherein one or more of the provisions set forth herein may be implemented, in accordance with some embodiments.

FIG. 7 and the following discussion provide a brief, general description of a suitable computing environment to implement embodiments of one or more of the provisions set forth herein. The operating environment of FIG. 7 is only one example of a suitable operating environment and is not intended to suggest any limitation as to the scope of use or functionality of the operating environment. Example computing devices include, but are not limited to, personal computers, server computers, hand-held or laptop devices, mobile devices (such as mobile phones, Personal Digital Assistants (PDAs), media players, and the like), multiprocessor systems, consumer electronics, mini computers, mainframe computers, distributed computing environments that include any of the above systems or devices, and the like.

Although not required, embodiments are described in the general context of "computer readable instructions" being executed by one or more computing devices. Computer readable instructions may be distributed via computer readable media (discussed below). Computer readable instructions may be implemented as program modules, such as functions, objects, Application Programming Interfaces (APIs), data structures, and the like, that perform particular tasks or implement particular abstract data types. Typically, the functionality of the computer readable instructions may be combined or distributed as desired in various environments.

FIG. 7 depicts an example of a system 700 comprising a computing device 712 configured as the controller 136 to implement some embodiments provided herein. In some configurations, computing device 712 includes at least one processing unit 716 and memory 718. Depending on the exact configuration and type of computing device, memory 718 may be volatile (such as RAM, for example), non-volatile (such as ROM, flash memory, etc., for example) or some combination of the two. This configuration is illustrated in FIG. 7 by dashed line 714.

In some embodiments, computing device 712 may include additional features and/or functionality. For example, computing device 712 may also include additional storage (e.g., removable and/or non-removable) including, but not limited to, magnetic storage, optical storage, and the like. Such additional storage is illustrated in FIG. 7 by storage 720. In some embodiments, computer readable instructions to implement one or more embodiments provided herein may be in storage 720. Storage 720 may also store other computer readable instructions to implement an operating system, an application program, and the like. Computer readable instructions may be loaded in memory 718 for execution by processing unit 716, for example.

The term "computer readable media" as used herein includes computer storage media. Computer storage media includes volatile and nonvolatile, removable and non-removable media implemented in any method or technology for storage of information such as computer readable instructions or other data. Memory 718 and storage 720 are examples of computer storage media. Computer storage media includes, but is not limited to, RAM, ROM, EEPROM, flash memory or other memory technology, CD-ROM, Digital Versatile Disks (DVDs) or other optical storage, magnetic cassettes, magnetic tape, magnetic disk storage or other magnetic storage devices, or any other medium which can be used to store the desired information and which can be accessed by computing device 712. Any such computer storage media may be part of computing device 712.

Computing device 712 may also include communication connection(s) 726 that allows computing device 712 to communicate with other devices. Communication connection(s) 726 may include, but is not limited to, a modem, a Network Interface Card (NIC), an integrated network interface, a radio frequency transmitter/receiver, an infrared port, a USB connection, or other interfaces for connecting computing device 712 to other computing devices. Communication connection(s) 726 may include a wired connection or a wireless connection. Communication connection(s) 726 may transmit and/or receive communication media.

The term "computer readable media" may include communication media. Communication media typically embodies computer readable instructions or other data in a "modulated data signal" such as a carrier wave or other transport mechanism and includes any information delivery media. The term "modulated data signal" may include a signal that has one or more of its characteristics set or changed in such a manner as to encode information in the signal.

Computing device 712 may include input device(s) 724 such as keyboard, mouse, pen, voice input device, touch input device, infrared cameras, video input devices, and/or any other input device. Output device(s) 722 such as one or more displays, speakers, printers, and/or any other output device may also be included in computing device 712. Input device(s) 724 and output device(s) 722 may be connected to computing device 712 via a wired connection, wireless connection, or any combination thereof. In some embodiments, an input device or an output device from another computing device may be used as input device(s) 724 or output device(s) 722 for computing device 712.

Components of computing device 712 may be connected by various interconnects, such as a bus. Such interconnects may include a Peripheral Component Interconnect (PCI), such as PCI Express, a Universal Serial Bus (USB), firewire (IEEE 1394), an optical bus structure, and the like. In some embodiments, components of computing device 712 may be interconnected by a network. For example, memory 718 may be comprised of multiple physical memory units located in different physical locations interconnected by a network.

Those skilled in the art will realize that storage devices utilized to store computer readable instructions may be distributed across a network. For example, a computing device 730 accessible via a network 728 may store computer readable instructions to implement one or more embodiments provided herein. Computing device 712 may access computing device 730 and download a part or all of the computer readable instructions for execution. Alternatively, computing device 712 may download pieces of the computer readable instructions, as needed, or some instructions may be executed at computing device 712 and some at computing device 730.

In some embodiments, integrating washing, transportation, and drying of the wafer carrier 108 in an integrated cleaning apparatus as described herein reduces the manual intervention or labor used to clean wafer carriers 108, thereby reducing or otherwise controlling the opportunities for external contaminants to be introduced. Additionally, the overall efficiency of the cleaning process is improved, allowing fabricators to achieve high throughput.

According to some embodiments, a cleaning apparatus that cleans a wafer carrier for holding wafers as part of a semiconductor fabrication process is provided. The cleaning apparatus includes a wet chamber that receives the wafer carrier to be washed, and a reservoir in fluid communication with the wet chamber. The reservoir stores a cleaning liquid that is introduced to the wafer carrier within the wet chamber during a washing operation. The cleaning apparatus also includes a dry chamber spaced apart from the wet chamber. The dry chamber receives the wafer carrier after the wafer carrier is washed in the wet chamber and holds the wafer carrier during a drying operation. The cleaning apparatus also includes a transport system that transports the wafer carrier between the wet chamber and the dry chamber during a cleaning process.

According to some embodiments, a method of cleaning a wafer carrier that is used for semiconductor fabrication is provided. The method includes controlling a transport system to retrieve the wafer carrier from a load port, and autonomously transporting the wafer carrier between the load port and a wet chamber where the wafer carrier is to be washed. The method also includes controlling introduction of a cleaning liquid to the wafer carrier within the wet chamber as part of a washing operation and, after the washing operation, autonomously transporting the wafer carrier between the wet chamber and a dry chamber where the wafer carrier is to be dried. The method also includes controlling operation of a drying system to remove at least a portion of the cleaning liquid from the wafer carrier within the dry chamber.

According to some embodiments, a dry chamber for drying a wafer carrier that has been washed is provided. The dry chamber includes a basin and a spin chuck within the basin. The spin chuck is pivotal about an axis of rotation. The dry chamber also includes a top surface that is adjustable between a closed state in which the top surface is located adjacent to a portion of the basin and an open state in which the top surface is elevated above the basin. The dry chamber also includes a suspension system that suspends the wafer carrier from the top surface. The wafer carrier cooperates with the spin chuck while the top surface is in the closed state and is pivotally adjusted by the spin chuck. The dry chamber also includes a first gas nozzle that emits a gas to concurrently dry an interior and an exterior of the wafer carrier during pivotal adjustment of the wafer carrier by the spin chuck.

Traditional cleaning processes that use a wet clean tool have used an oven that exposes wafer carriers to an elevated temperature to dry the wafer carriers. There are still residues and/or water left by the traditional cleaning process, so an oven process is further needed for high quality containers.

The foregoing outlines features of several embodiments so that those of ordinary skill in the art may better understand various aspects of the present disclosure. Those of ordinary skill in the art should appreciate that they may readily use the present disclosure as a basis for designing or modifying other processes and structures for carrying out the same purposes and/or achieving the same advantages of various embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc., depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A dry chamber for drying a wafer carrier that has been washed, the dry chamber comprising:
- a basin;
- a spin chuck in the basin, wherein the spin chuck is pivotal about an axis of rotation;
- a top surface that is adjustable between a closed state in which the top surface is located adjacent to a portion of the basin and an open state in which the top surface is elevated above the basin;
- a suspension system that suspends the wafer carrier from the top surface, wherein the wafer carrier cooperates with the spin chuck while the top surface is in the closed state and is pivotally adjusted by the spin chuck; and
- a first gas nozzle that emits a gas to concurrently dry an interior and an exterior of the wafer carrier during pivotal adjustment of the wafer carrier by the spin chuck.

2. The dry chamber of claim 1, comprising:
- a second gas nozzle, wherein the first gas nozzle is arranged a first radial distance from the axis of rotation of the spin chuck, and the second gas nozzle is arranged a second radial distance from the axis of rotation of the spin chuck, wherein the first radial distance is different than the second radial distance.

3. The dry chamber of claim 1, comprising:
- a first heating element arranged a first radial distance from the axis of rotation of the spin chuck; and
- a second heating element arranged a second radial distance from the axis of rotation of the spin chuck, wherein the first radial distance is different than the second radial distance.

4. The dry chamber of claim 3, wherein:
the first heating element is disposed within the wafer carrier when the top surface is in the closed state, and
the second heating element is disposed outside the wafer carrier when the top surface is in the closed state.

5. The dry chamber of claim 1, comprising:
a second gas nozzle, wherein
the first gas nozzle is disposed within the wafer carrier when the top surface is in the closed state, and
the second gas nozzle is disposed outside the wafer carrier when the top surface is in the closed state.

6. The dry chamber of claim 1, wherein the spin chuck pivots about the axis of rotation to pivotally adjust an orientation of the wafer carrier within the dry chamber and to generate a centrifugal force that removes at least a portion of a cleaning liquid from the wafer carrier during a drying operation.

7. The dry chamber of claim 1, comprising:
a first infrared lamp arranged adjacent to the spin chuck, wherein the first infrared lamp emits first infrared radiation that is imparted onto the wafer carrier supported by the spin chuck in the dry chamber during a drying operation.

8. The dry chamber of claim 7, comprising:
a second infrared lamp arranged adjacent to the spin chuck, wherein:
the second infrared lamp emits second infrared radiation that is imparted onto the wafer carrier supported by the spin chuck in the dry chamber during the drying operation,
the first infrared lamp is spaced a first radial distance from the axis of rotation,
the second infrared lamp is spaced a second radial distance from the axis of rotation, and
the second radial distance is different than the first radial distance.

9. The dry chamber of claim 1, wherein the suspension system suspends the wafer carrier from the top surface to enable a bottom surface of the wafer carrier, facing diametrically opposite to the top surface of the dry chamber and defining an opening, to be exposed.

10. The dry chamber of claim 9, wherein the first gas nozzle is disposed within the opening when the top surface is in the closed state.

11. The dry chamber of claim 9, comprising:
a heating element disposed within the opening when the top surface is in the closed state.

12. The dry chamber of claim 11, wherein the heating element is an infrared lamp.

13. A cleaning apparatus for cleaning a wafer carrier that holds wafers as part of a semiconductor fabrication process, the cleaning apparatus comprising:
a wet chamber that receives the wafer carrier to be washed during a washing operation;
a dry chamber spaced apart from the wet chamber, wherein:
the dry chamber is configured to receive the wafer carrier after the wafer carrier is washed in the wet chamber and hold the wafer carrier during a drying operation,
the dry chamber comprises a first infrared lamp, a basin, a top surface, and a suspension system,
the first infrared lamp emits first infrared radiation that is imparted onto the wafer carrier during the drying operation,
the top surface is adjustable between a closed state in which the top surface is located adjacent to a portion of the basin and an open state in which the top surface is elevated above the basin, and
the suspension system suspends the wafer carrier from the top surface to enable a bottom surface of the wafer carrier, facing diametrically opposite to the top surface of the dry chamber and defining an opening, to be exposed; and
a transport system that transports the wafer carrier between the wet chamber and the dry chamber during a cleaning process.

14. The cleaning apparatus of claim 13, comprising:
a gas system that emits a drying gas into the dry chamber during the drying operation to remove cleaning liquid from the wafer carrier; and
a dry pump that evacuates the dry chamber during the drying operation.

15. The cleaning apparatus of claim 13, comprising:
a buffer chamber configured to store the wafer carrier between completion of the washing operation within the wet chamber and introduction of the wafer carrier to the dry chamber, wherein the transport system transports the wafer carrier between the wet chamber, the buffer chamber, and the dry chamber.

16. The cleaning apparatus of claim 13, wherein the first infrared lamp is disposed within the opening when the top surface is in the closed state.

17. The cleaning apparatus of claim 13, wherein the dry chamber comprises a first gas nozzle that emits a gas to dry an interior of the wafer carrier, wherein the first gas nozzle is disposed within the opening when the top surface is in the closed state.

18. A cleaning apparatus for cleaning a wafer carrier that holds wafers as part of a semiconductor fabrication process, the cleaning apparatus comprising:
a wet chamber that receives the wafer carrier to be washed during a washing operation;
a dry chamber spaced apart from the wet chamber, wherein the dry chamber is configured to receive the wafer carrier after the wafer carrier is washed in the wet chamber and hold the wafer carrier during a drying operation, wherein the dry chamber is configured to vary a relative height between a spin chuck disposed in the dry chamber and the wafer carrier through a suspension system that suspends the wafer carrier from a top surface of the dry chamber to enable a bottom surface of the wafer carrier, facing diametrically opposite to the top surface of the dry chamber and defining an opening, to be exposed;
a transport system that transports the wafer carrier between the wet chamber and the dry chamber during a cleaning process; and
a buffer chamber that stores the wafer carrier between completion of the washing operation within the wet chamber and introduction of the wafer carrier to the dry chamber, wherein the transport system transports the wafer carrier between the wet chamber, the buffer chamber, and the dry chamber.

19. The cleaning apparatus of claim 18, comprising:
a gas nozzle that emits a gas into the dry chamber to remove impurities from the wafer carrier introduced as a result of the washing operation.

20. The cleaning apparatus of claim 18, comprising:

a load port into which the wafer carrier is inserted into the cleaning apparatus from an ambient environment, wherein the transport system transports the wafer carrier between the load port and the wet chamber.

* * * * *